(12) United States Patent
Jeon et al.

(10) Patent No.: US 7,663,250 B2
(45) Date of Patent: Feb. 16, 2010

(54) WAFER LEVEL PACKAGE AND MANUFACTURING METHOD THEREOF

(75) Inventors: Hyung Jin Jeon, Gunpo-si (KR); Sung Yi, Suwon-si (KR); Jong Yun Lee, Incheon-si (KR); Young Do Kweon, Seoul (KR); Jong Hwan Baek, Seoul (KR)

(73) Assignee: Samsung Electro-Mechanics Co., Ltd., Suwon (KR)

( * ) Notice: Subject to any disclaimer, the term of this patent is extended or adjusted under 35 U.S.C. 154(b) by 0 days.

(21) Appl. No.: 12/230,793

(22) Filed: Sep. 4, 2008

(65) Prior Publication Data

US 2009/0309216 A1    Dec. 17, 2009

(30) Foreign Application Priority Data

Jun. 17, 2008    (KR) .................... 10-2008-0056817

(51) Int. Cl.
*H01L 23/48* (2006.01)
*H01L 23/52* (2006.01)
*H01L 29/40* (2006.01)

(52) U.S. Cl. .................. 257/780; 257/781; 438/613

(58) Field of Classification Search ................. 257/780, 257/781, 737; 438/613, 614, FOR. 643
See application file for complete search history.

(56) References Cited

U.S. PATENT DOCUMENTS

| | | | |
|---|---|---|---|
| 6,930,032 B2 | 8/2005 | Sarihan et al. | |
| 7,164,208 B2 * | 1/2007 | Kainou et al. | 257/780 |
| 2006/0113681 A1 * | 6/2006 | Jeong et al. | 257/780 |
| 2006/0246706 A1 | 11/2006 | Ke et al. | |
| 2007/0018321 A1 * | 1/2007 | Hiatt et al. | 257/737 |
| 2007/0069394 A1 * | 3/2007 | Bachman et al. | 257/780 |
| 2007/0114674 A1 * | 5/2007 | Brown | 257/780 |

* cited by examiner

*Primary Examiner*—S. V Clark

(57) ABSTRACT

A wafer level package and a manufacturing method thereof capable of reducing stress between an under bump metal and a bump. The wafer level package includes a substrate provided with a plurality of chip pads on a top surface; a first passivation layer to expose the chip pads; vias connected to the chip pads by passing through the first passivation layer; a metal wiring layer formed on the first passivation layer and connected to the vias; an under bump metal formed on the first passivation layer to be connected to the metal wiring layer and having a buffer pattern separated through a trench on a center; a second passivation layer formed on the first passivation layer to expose the under bump metal; a first bump formed on the buffer pattern; and a second bump filling the trench and formed on the first bump and the under bump metal.

12 Claims, 3 Drawing Sheets

[FIG. 1]
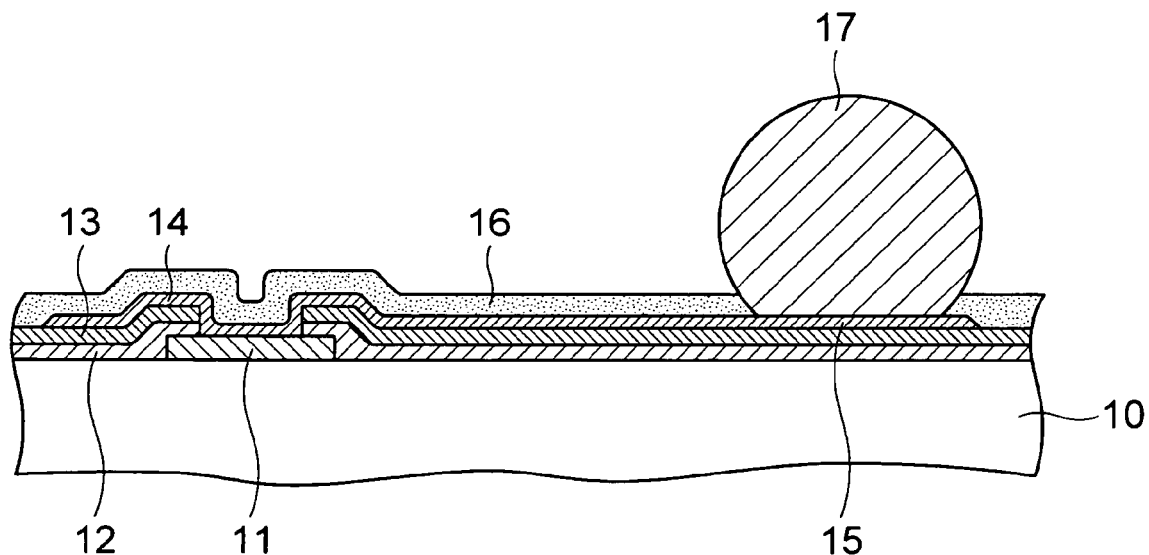
- Prior Art
[FIG. 2]
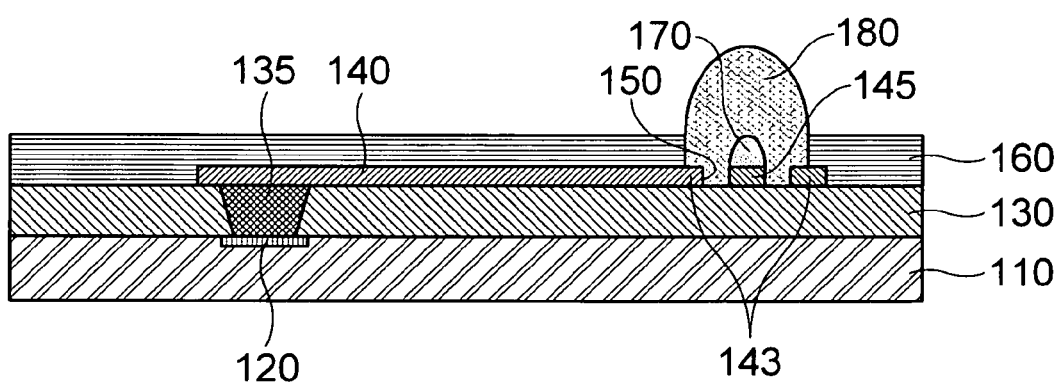

[FIG. 3]
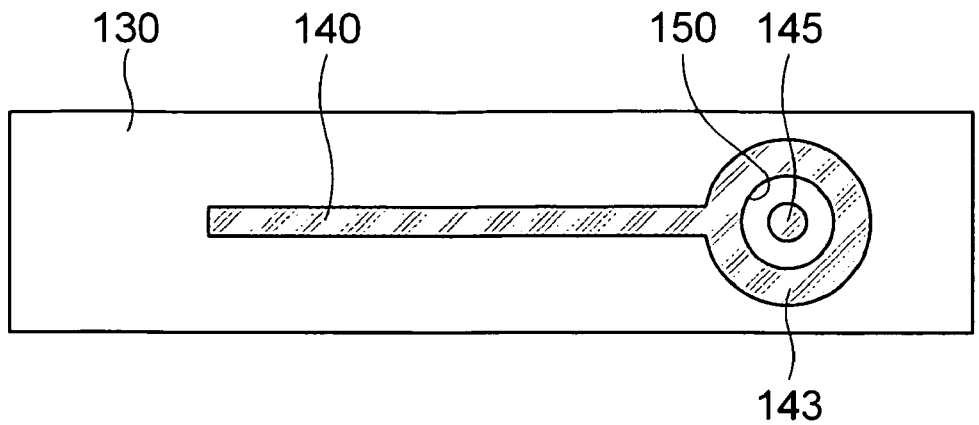
[FIG. 4]
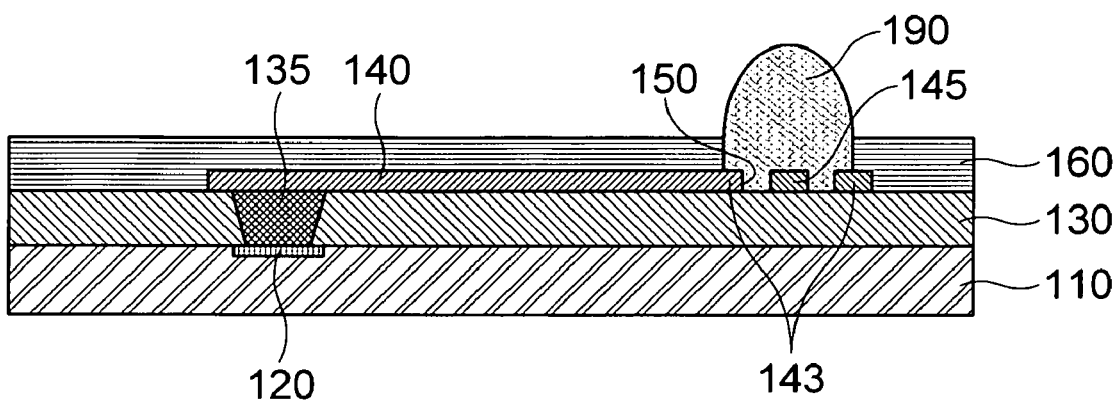
[FIG. 5]
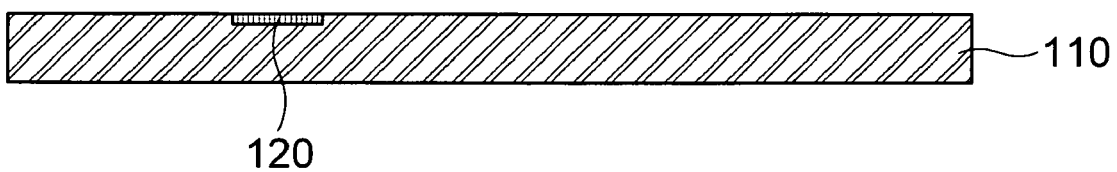
[FIG. 6]
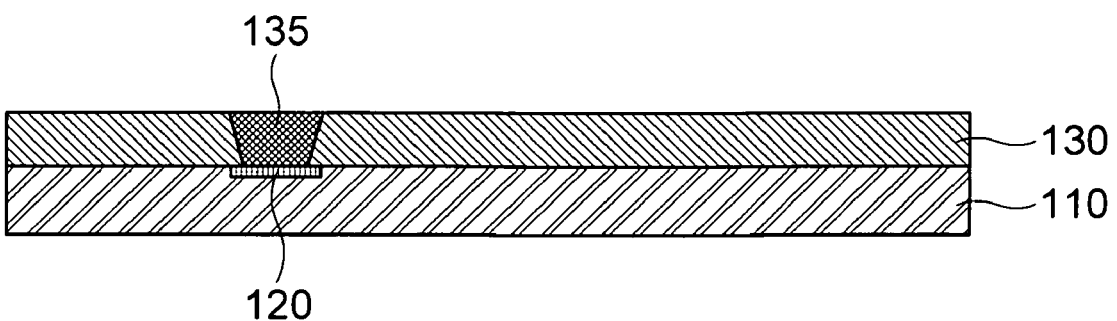

[FIG. 7]
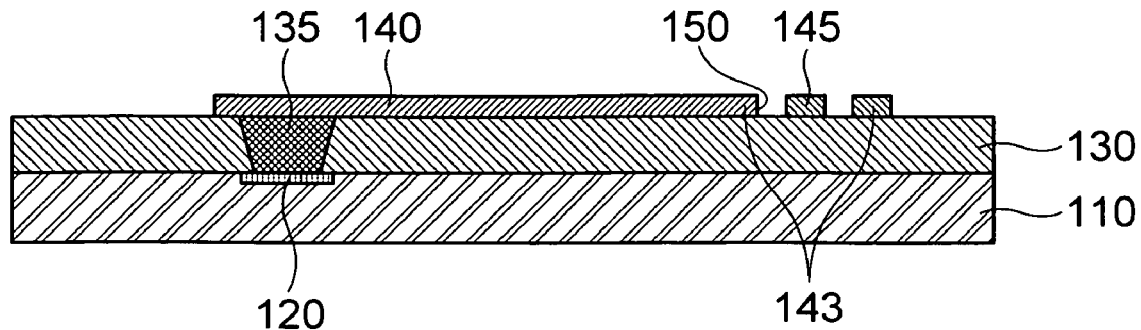
[FIG. 8]
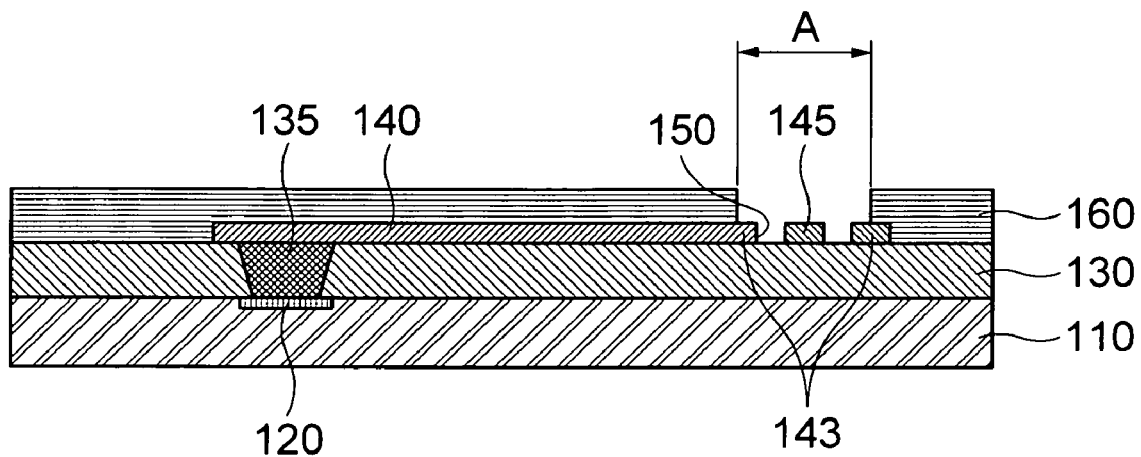
[FIG. 9]
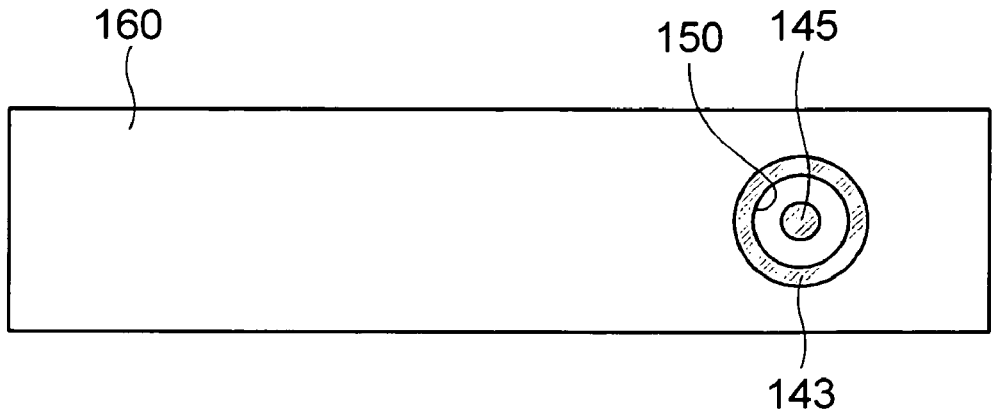

WAFER LEVEL PACKAGE AND MANUFACTURING METHOD THEREOF

CROSS-REFERENCE TO RELATED APPLICATIONS

This application claims the benefit of Korean Patent Application No. 10-2008-0056817 filed with the Korea Intellectual Property Office on Jun. 17, 2008, the disclosure of which is incorporated herein by reference.

BACKGROUND OF THE INVENTION

1. Field of the Invention

The present invention relates to a wafer level package and a manufacturing method thereof; and, more particularly, to a WLP (Wafer Level Package) capable of improving bonding reliability between an under bump metal and a bump formed on an upper part thereof by forming a buffer pattern on a central part of the under bump metal of a metal wiring layer through a trench and a manufacturing method thereof.

2. Description of the Related Art

As electronic appliances have become gradually smaller, lighter, high speed and high capacity, the development of a semiconductor package with a new structure has been needed so that the semiconductor package corresponds to the development trend of the electronic appliances. A WLP (Wafer Level Package) has been known as a semiconductor package most suitable for miniaturization and high speed among semiconductor packages introduced so far.

The WLP is a package which is progressed and formed in a state in which a semiconductor chip is not separated from a wafer.

Hereinafter, a conventional wafer level package will be described with reference to a related drawing.

FIG. 1 is a cross-sectional view showing a conventional wafer level package.

Referring to FIG. 1, a wafer level package includes a silicon substrate 10 having a chip pad 11 and a passivation layer 12 to protect the chip pad 11.

And, an insulation layer 13 (Hereinafter, referring to as 'a first insulation layer') having a predetermined thickness is formed on an upper surface of the silicon substrate 10 to expose the chip pad 11 and a metal wiring layer 14 connected to the chip pad 11 and a ball pad unit 15 are formed on an upper part of the first insulation layer 13 to rearrange the chip pad 11.

Further, on the metal wiring layer 14 and the ball pad unit 15, a second insulation layer 16 is formed to cover the first insulation layer 13 and the metal wiring layer 14 and exposes a part of the ball pad unit 15.

In addition, a circular solder ball 17 is formed on the ball pad unit 15 exposed by the second insulation layer 16.

However, the conventional wafer level package manufactured in a wafer level has disadvantages of increasing resistance by causing a crack of an interface between the ball pad unit 15 and the solder ball 17 when mounting the solder ball 17 and of reducing reliability of a device by causing an open phenomenon in case of excessive resistance.

In order to improve a bonding failure of the solder ball 17, Japanese Patent No. 3975569 has been published for two ball bumps in the name of SONY CORP.

The above-mentioned "two ball bumps" are capable of regulating heat stress between a semiconductor device and a print wiring substrate and improving the intensity of a bonding portion therebetween by including a first solder ball bump composed of a high melting point solder formed on an electrode pad of the semiconductor device and a second solder ball bump which is overlapped with the first solder ball bump at least in a vertical direction with respect to the electrode pad.

However, there is a disadvantage of increasing a chip size and the number of processes by forming a multilayer solder ball.

Further, there is a disadvantage of reducing a signal transmission speed by increasing parasitic capacitance formed on a substrate, an insulation layer and a ball pad when increasing an area of the solder ball.

SUMMARY OF THE INVENTION

The present invention has been invented in order to overcome the above-described problems and it is, therefore, an object of the present invention to provide a wafer level package and a manufacturing method thereof capable of improving bonding reliability between an under bump metal and a bump by forming a buffer pattern separated through a trench on a center of the under bump metal used as a ball pad.

In accordance with the present invention to achieve the object, there is provided a wafer level package including a substrate provided with a plurality of chip pads on a top surface; a first passivation layer to expose the chip pads; vias connected to the chip pad by passing through the first passivation layer; a metal wiring layer formed on the first passivation layer and connected to the vias; an under bump metal formed on the first passivation layer to be connected to the metal wiring layer and having a buffer pattern separated through a trench on a center; a second passivation layer formed on the first passivation layer to expose the under bump metal; a first bump formed on the buffer pattern; and a second bump filling the trench and formed on the first bump and the under bump metal.

At this time, the buffer pattern may be formed on the center of the under bump metal in a circular shape and the trench may be formed to expose an upper part of the first passivation layer.

Further, the second bump may be made of material containing more Ag than that of the first bump and the second bump may be made of epoxy material.

And, in accordance with a modified embodiment of the present invention, there is provided a wafer level package including a substrate provided with a plurality of chip pads on a top surface; a first passivation layer to expose the chip pads; vias connected to the chip pads by passing through the first passivation layer; a metal wiring layer formed on the first passivation layer and connected to the vias; an under bump metal formed on the first passivation layer to be connected to the metal wiring layer and having a buffer pattern separated through a trench on a center; a second passivation layer formed on the first passivation layer to expose the under bump metal; and a bump filling the trench and formed on the buffer pattern and the under bump metal.

Further, in accordance with one embodiment of the present invention to achieve the object, there is provided a manufacturing method of a wafer level package including the steps of: preparing a substrate provided with a plurality of chip pads; forming a first passivation layer on the substrate; forming vias exposing the chip pads by patterning the first passivation layer; coating metallic material on the first passivation layer including the vias; forming a metal wiring layer connected to the vias and an under bump metal with a buffer pattern separated through a trench on a center by patterning the metallic material; forming a second passivation layer to open an upper part of the under bump metal; forming a first bump on the buffer pattern; and filling the trench and forming a second bump on the first bump and the under bump metal.

At this time, the buffer pattern may be formed on the center of the under bump metal in a circular shape and the trench may be formed to expose an upper part of the first passivation layer.

Further, the second bump may be made of material containing more Ag than that of the first bump and the second bump may be formed by using epoxy material.

And, in accordance with a modified embodiment of the present invention, there is provided a manufacturing method of a wafer level package including the steps of: preparing a substrate provided with a plurality of chip pads; forming a first passivation layer on the substrate; forming vias exposing the chip pads by patterning the first passivation layer; coating metallic material on the first passivation layer including the vias; forming a metal wiring layer connected to the vias and an under bump metal with a buffer pattern separated through a trench on a center by patterning the metallic material; forming a second passivation layer to open an upper part of the under bump metal; and filling the trench and forming a bump on the buffer pattern and the under bump metal.

BRIEF DESCRIPTION OF THE DRAWINGS

These and/or other aspects and advantages of the present general inventive concept will become apparent and more readily appreciated from the following description of the embodiments, taken in conjunction with the accompanying drawings of which:

FIG. 1 is a cross sectional view showing a conventional wafer level package;

FIG. 2 is a cross sectional view showing a wafer level package in accordance with one embodiment of the present invention;

FIG. 3 is a plan-view showing an under bump metal and a buffer pattern in FIG. 2;

FIG. 4 is a cross sectional view showing a wafer level package in accordance with a modified embodiment of the present invention; and FIG. 5 to FIG. 9 are cross sectional views sequentially showing a manufacturing method of a wafer level package in accordance with one embodiment of the present invention.

DETAILED DESCRIPTION OF THE PREFERABLE EMBODIMENTS

Hereinafter, a matter regarding to a construction, a manufacturing method and an operation effect of a wafer level package in accordance with the present invention will be appreciated clearly through the following detailed description with reference to the accompanying drawings illustrating preferable embodiments of the present invention.

Hereinafter, a wafer level package and a manufacturing method thereof in accordance with one embodiment of the present invention will be described in detail with reference to the accompanying drawings.

FIG. 2 is a cross sectional view showing a wafer level package in accordance with one embodiment of the present invention, FIG. 3 is a plan-view showing an under bump metal and a buffer pattern in FIG. 2 and FIG. 4 is a cross sectional view showing a wafer level package in accordance with a modified embodiment of the present invention.

First of all, as shown in FIG. 2, in accordance with one embodiment of the present invention, the wafer level package includes a substrate 110 provided with a chip pad 120, first and second passivation layers 130 and 160 having a via 135 and formed on the substrate 110, a metal wiring layer 140 electrically connected to the via 135, an under bump metal 143 formed at one end of the metal wiring layer 140 and having a buffer pattern 145 on a center, and first and second bumps 170 and 180 formed on the under bump metal 143.

Herein, the substrate 110 as a substrate for a wafer level package may include a plurality of semiconductor chips or circuit patterns (not shown) inside other than the chip pad 120.

The chip pad 120 electrically connects the internally connected semiconductor chips or circuit patterns to external terminals and therefore is preferably made of conductive material such as aluminum, copper, and so on.

Although the chip pad 120 is formed to be impregnated inside the substrate 110, it may be formed on an upper part of the substrate 110. Further, although the one chip pad 120 is formed in FIG. 2, a plurality of chip pads 120 may be formed on the substrate 110 without limiting to the one chip pad 120.

The first passivation layer 130 is formed on the substrate 120 with the chip pad 120 and the via 135 is formed on a position corresponding to the chip pad 120.

The metal wiring layer 140 is connected to the via 135 and formed on the first passivation layer 130. At this time, the metal wiring layer 140 may be made of the same conductive material as that of the via 135 and they may be made of different conductive material to each other.

Further, the under bump metal 143 is formed at one end of the metal wiring layer 140 to be electrically connected to the outside. At this time, the under bump metal 143 is formed in a circular shape and has a circular buffer pattern 145 on a center thereof.

The buffer pattern 145 is separated from the under bump metal 143 through a trench 150 formed to expose an upper part of the first passivation layer 130 and made of conductive material together with the under bump metal 143.

The second passivation layer 160 is formed on the first passivation layer 130 on which the under bump metal 143 with the buffer pattern 145 and the metal wiring layer 140 are formed.

At this time, the second passivation layer 160 is formed to prevent the metal wiring layer 140 from being electrically connected to the outside and an upper part thereof is opened to expose upper parts of the under bump metal 143 and the buffer pattern 145.

And, the first bump 170 is formed on the exposed buffer pattern 145 and the second bump 180 is formed on the under bump metal 143 and the first bump 170. Particularly, the second bump 180 is formed to fill the trench 180.

At this time, the first bump 170 is preferably formed by using rigid material containing less Ag than that of the second bump 180 and the second bump 180 is preferably formed by using flexible material containing more Ag than that of the first bump 170. The reason is that the first bump 170 is made of the rigid material to stand mechanical impact such as a drop test, and so on and the second bump 180 is made of the flexible material to prevent a crack between the substrate 110 and the first and second bumps 170 and 180 due to a thermal expansion test.

Further, the second bump 180 may be formed by using epoxy material as the flexible material.

Therefore, in accordance with the present invention, the wafer level package is capable of improving bonding reliability between the under bump metal 143 and buffer pattern 145 and the first and second bumps 170 and 180 by standing the mechanical impact with the first bump 170 and preventing the crack due to thermal expansion with the second bump 180.

Meanwhile, as shown in FIG. 4 which is a cross sectional view showing a wafer level package in accordance with a modified embodiment of the present invention, on the buffer pattern 145 and the under bump metal 143, the first bump 170 and the second bump 180 are not formed and one bump 190 is formed.

At this time, the bump 190 is formed to fill the trench 150 between the under bump metal 143 and the buffer pattern 145.

The wafer level package constructed as described above is capable of improving a bonding force between the under bump metal 143 and buffer pattern 145 and the bump 190 by reducing irregular expansion of the under bump metal 143 due to the thermal expansion through the trench 150.

Hereinafter, a manufacturing method of a wafer level package in accordance with one embodiment of the present invention will be described in detail with reference to the accompanying drawings.

FIG. 5 to FIG. 9 are cross sectional views sequentially showing a manufacturing method of the wafer level package in accordance with the one embodiment of the present invention.

First of all, as shown in FIG. 5, a substrate 110 is prepared.

Then, a chip pad 120 is formed on the prepared substrate 10. At this time, although the one chip pad 120 is formed in FIG. 5, a plurality of chip pads 120 may be formed on the substrate 110 without limiting to the one chip pad 120.

After forming the chip pad 120, as shown in FIG. 6, a first passivation layer 130 is formed on an upper part of the substrate 110 on which the chip pad 120 is formed. At this time, the first passivation layer 130 is preferably made of insulating material.

After opening a region of the first passivation layer 130 corresponding to the chip pad 120, the region is filled with conductive material to form a via 135.

Then, metallic material is coated on the first passivation layer 130 with the via 135. A metal wiring layer 140, an under bump metal 143 and a buffer pattern 145, as shown in FIG. 7, are formed through exposure and development processes or a laser process for the coated metallic material.

At this time, the buffer pattern 145 is formed on a center of the under bump metal 143 and separated from the under bump metal 143 through a trench 150 to expose an upper part of the first passivation layer 130.

Particularly, although the buffer pattern 145 may be formed in various shapes such as a square, a triangle, and so on, it is preferably formed in a circular shape in consideration of a shape of a first bump to be formed on the buffer pattern 145, an adhesion force, and so on.

After forming the metal wiring layer 140, the under bump metal 143 and the buffer pattern, a second passivation layer 160 is formed thereon as shown in FIG. 8.

After forming the second passivation layer 160, an "A" region of the second passivation layer 160 is opened by performing an etching processing to expose the under bump metal 143 and the buffer pattern 145.

At this time, when the second passivation layer 160 is patterned, the circular under bump metal 143 and buffer pattern 145 are exposed outside as shown in FIG. 9.

After patterning the second passivation layer 160, a first bump 170 having a predetermined size is formed only on the buffer pattern 145. At this time, the first bump 170 may be formed by using rigid material containing a small amount of Ag. Because the first bump is formed by using the rigid material, the first bump 170 is not separated from the buffer pattern 145 in spite of external mechanical impact, thereby improving an adhesion force.

After forming the first bump 170, a second bump 180 for filling the trench 150 and covering the under bump metal 143 and the first bump 170 is formed to manufacture the wafer level package in FIG. 2.

At this time, because the second bump 180 is formed on the trench 150 and the under bump metal 143, a bonding area is increased in comparison with a conventional under bump metal formed in a plane shape to improve a bonding force.

Further, the wafer level package is capable of preventing a crack between the under bump metal 143 and the second bump 180 in expansion of the under bump metal 143 due to heat by having the predetermined additional space between the under bump metal 143 and the buffer pattern 145 through the trench 150.

Accordingly, the second bump 180 is preferably made of flexible material containing more Ag than that of the first bump 170 and epoxy material may be used as the flexible material.

Meanwhile, as shown in FIG. 4, after forming the second passivation layer 160, one bump 190 may be formed on the "A" region.

At this time, the bump 190 may be a solder bump or a bump made of the epoxy material.

In accordance with the one embodiment of the present invention, the wafer level package manufactured through the above-mentioned processes is capable of improving the bonding force by increasing the bonding area between the under bump metal and the bump formed on an upper part thereof by forming the buffer pattern 145 on the center of the under bump metal 143 through the trench 150.

Further, the present invention is capable of preventing the crack between the first and second bumps 170 and 180 in the external mechanical impact and the thermal expansion by forming the first bump 170 on the buffer pattern 145 and forming the second bump 180 on the trench 150, the under bump metal 143 and the first bump 170.

As described above, in accordance with the present invention, the wafer level package and the manufacturing method thereof are capable of improving the bonding reliability between the under bump metal and the bump by forming the buffer pattern separated through the trench on the center of the under bump metal used as the ball pad.

Further, the wafer level package and the manufacturing method thereof are capable of preventing the crack due to the mechanical impact and the thermal expansion of the substrate by forming the first bump on the buffer pattern with the rigid material containing a small amount of Ag and forming the second bump on the under bump metal and the first bump with the flexible material containing a large amount of Ag.

As described above, although the preferable embodiments of the present invention have been shown and described, it will be appreciated by those skilled in the art that substitutions, modifications and changes may be made in this embodiment without departing from the principles and spirit of the general inventive concept, the scope of which is defined in the appended claims and their equivalents.

What is claimed is:

1. A wafer level package comprising:
   a substrate provided with a plurality of chip pads on a top surface;
   a first passivation layer to expose the chip pads;
   vias connected to the chip pads by passing through the first passivation layer;
   a metal wiring layer formed on the first passivation layer and connected to the vias;

an under bump metal formed on the first passivation layer to be connected to the metal wiring layer and including a buffer pattern separated through a trench on a center;

a second passivation layer formed on the first passivation layer to expose the under bump metal;

a first bump formed on the buffer pattern; and a second bump filling the trench and formed on the first bump and the under bump metal.

2. The wafer level package according to claim 1, wherein the buffer pattern is formed on the center of the under bump metal in a circular shape.

3. The wafer level package according to claim 1, wherein the trench is formed to expose an upper part of the first passivation layer.

4. The wafer level package according to claim 1, wherein the second bump is made of material containing more Ag than that of the first bump.

5. The wafer level package according to claim 1, wherein the second bump is made of epoxy material.

6. A wafer level package comprising:
   a substrate provided with a plurality of chip pads on a top surface;
   a first passivation layer to expose the chip pads;
   vias connected to the chip pads by passing through the first passivation layer;
   a metal wiring layer formed on the first passivation layer and connected to the vias;
   an under bump metal formed on the first passivation layer to be connected to the metal wiring layer and including a buffer pattern separated through a trench on a center;
   a second passivation layer formed on the first passivation layer to expose the under bump metal; and
   a bump filling the trench and formed on the buffer pattern and the under bump metal.

7. A manufacturing method of a wafer level package comprising:
   preparing a substrate provided with a plurality of chip pads;
   forming a first passivation layer on the substrate;
   forming vias exposing the chip pads by patterning the first passivation layer;
   coating metallic material on the first passivation layer including the vias;
   forming a metal wiring layer connected to the vias and an under bump metal with a buffer pattern separated through a trench on a center by patterning the metallic material;
   forming a second passivation layer to open an upper part of the under bump metal;
   forming a first bump on the buffer pattern; and
   filling the trench and forming a second bump on the first bump and the under bump metal.

8. The method according to claim 7, wherein the buffer pattern is formed on the center of the under bump metal in a circular shape.

9. The method according to claim 7, wherein the trench is formed to expose an upper part of the first passivation layer.

10. The method according to claim 7, wherein the second bump is made of material containing more Ag than that of the first bump.

11. The method according to claim 7, wherein the second bump is formed by using epoxy material.

12. A manufacturing method of a wafer level package comprising:
    preparing a substrate provided with a plurality of chip pads;
    forming a first passivation layer on the substrate;
    forming vias exposing the chip pads by patterning the first passivation layer;
    coating metallic material on the first passivation layer including the vias;
    forming a metal wiring layer connected to the vias and an under bump metal with a buffer pattern separated through a trench on a center by patterning the metallic material;
    forming a second passivation layer to open an upper part of the under bump metal; and
    filling the trench and forming a bump on the buffer pattern and the under bump metal.

* * * * *